United States Patent
Kobayashi et al.

(10) Patent No.: US 9,899,503 B2
(45) Date of Patent: Feb. 20, 2018

(54) SEMICONDUCTOR DEVICE HAVING FIRST AND SECOND GATE ELECTRODES

(71) Applicant: FUJI ELECTRIC CO., LTD., Kawasaki-shi, Kanagawa (JP)

(72) Inventors: Yusuke Kobayashi, Tsukuba (JP); Yuichi Onozawa, Matsumoto (JP); Manabu Takei, Tsukuba (JP); Akio Nakagawa, Chigasaki (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/250,146

(22) Filed: Aug. 29, 2016

(65) Prior Publication Data
US 2016/0365434 A1    Dec. 15, 2016

Related U.S. Application Data

(63) Continuation of application No. PCT/JP2015/072651, filed on Aug. 10, 2015.

(30) Foreign Application Priority Data

Aug. 20, 2014    (JP) ................................ 2014-167427

(51) Int. Cl.
*H01L 29/739* (2006.01)
*H01L 29/78* (2006.01)
(Continued)

(52) U.S. Cl.
CPC ...... *H01L 29/7397* (2013.01); *H01L 29/0619* (2013.01); *H01L 29/0649* (2013.01);
(Continued)

(58) Field of Classification Search
CPC ............. H01L 29/0619; H01L 29/0649; H01L 29/1095; H01L 29/404; H01L 29/42364;
(Continued)

(56) References Cited

U.S. PATENT DOCUMENTS

5,329,142 A    7/1994    Kitagawa et al.
6,815,769 B2    11/2004    Pfirsch et al.
(Continued)

FOREIGN PATENT DOCUMENTS

JP    H05-243561 A    9/1993
JP    2001-177091 A    6/2001
(Continued)

OTHER PUBLICATIONS

Norihito Tokura, "Influence of Floating P-Base on Turn-On Characteristics of Trench-Gate FS-IGBT", The Institute of Electrical Engineers Journal D, The Institute of Electrical Engineers of Japan (IEEJ), vol. 130, No. 6, pp. 728-733, Jan. 2010.
(Continued)

*Primary Examiner* — Shahed Ahmed
(74) *Attorney, Agent, or Firm* — Rabin & Berdo, P.C.

(57) ABSTRACT

In mesa regions between adjacent trenches disposed in an $n^-$-type drift layer and in which a first gate electrode is disposed via a first gate insulating film, a p-type base region and a floating $p^+$-type region of which a surface is partially covered by a second gate electrode via a second gate insulating film are disposed. An emitter electrode contacts the p-type base region and an $n^+$-type emitter region, and is electrically isolated from first and second gate electrodes and the floating $p^+$-type region by an interlayer insulating film covering the first and second gate electrodes and a portion of the floating $p^+$-type region not covered by the second gate electrode. Thus, turn-on dV/dt controllability by the gate resistance Rg may be improved.

4 Claims, 16 Drawing Sheets

(51) Int. Cl.
  *H01L 29/06* (2006.01)
  *H01L 29/10* (2006.01)
  *H01L 29/423* (2006.01)
  *H01L 29/66* (2006.01)
  *H01L 29/40* (2006.01)

(52) U.S. Cl.
  CPC ........ *H01L 29/1095* (2013.01); *H01L 29/404* (2013.01); *H01L 29/42364* (2013.01); *H01L 29/66348* (2013.01); *H01L 29/78* (2013.01)

(58) Field of Classification Search
  CPC ........... H01L 29/66348; H01L 29/7397; H01L 29/78; H01L 29/7396; H01L 29/739; H01L 29/08
  USPC ........ 257/197, 474, 477, 565, 586; 438/170, 438/189, 203, 235, 309, 336
  See application file for complete search history.

(56) References Cited

U.S. PATENT DOCUMENTS

| | | |
|---|---|---|
| 2002/0179976 A1 | 12/2002 | Takahashi |
| 2005/0161768 A1 | 7/2005 | Sugiyama et al. |
| 2011/0260212 A1* | 10/2011 | Tsuzuki .............. H01L 29/0696 257/139 |
| 2014/0027814 A1 | 1/2014 | Pfirsch |
| 2014/0061719 A1* | 3/2014 | Takei ................... H01L 29/402 257/139 |
| 2016/0181374 A1* | 6/2016 | Hiyoshi ............ H01L 29/42368 257/77 |

FOREIGN PATENT DOCUMENTS

| | | |
|---|---|---|
| JP | 2002-190595 A | 7/2002 |
| JP | 2002-353456 A | 12/2002 |
| JP | 2005032941 A | 2/2005 |
| JP | 2005-191221 A | 7/2005 |
| JP | 2011-243946 A | 12/2011 |
| JP | 2012-151470 A | 8/2012 |
| JP | 2014-053409 A | 3/2014 |

OTHER PUBLICATIONS

Y. Onozawa et al., "Development of the next generation 1200V trench-gate FS-IGBT featuring lower EMI noise and lower switching loss", Proceedings of the 19th International Symposium on Power Semiconductor Devices & ICs, (Jejudo), pp. 13-16, May 27-30, 2007.

* cited by examiner

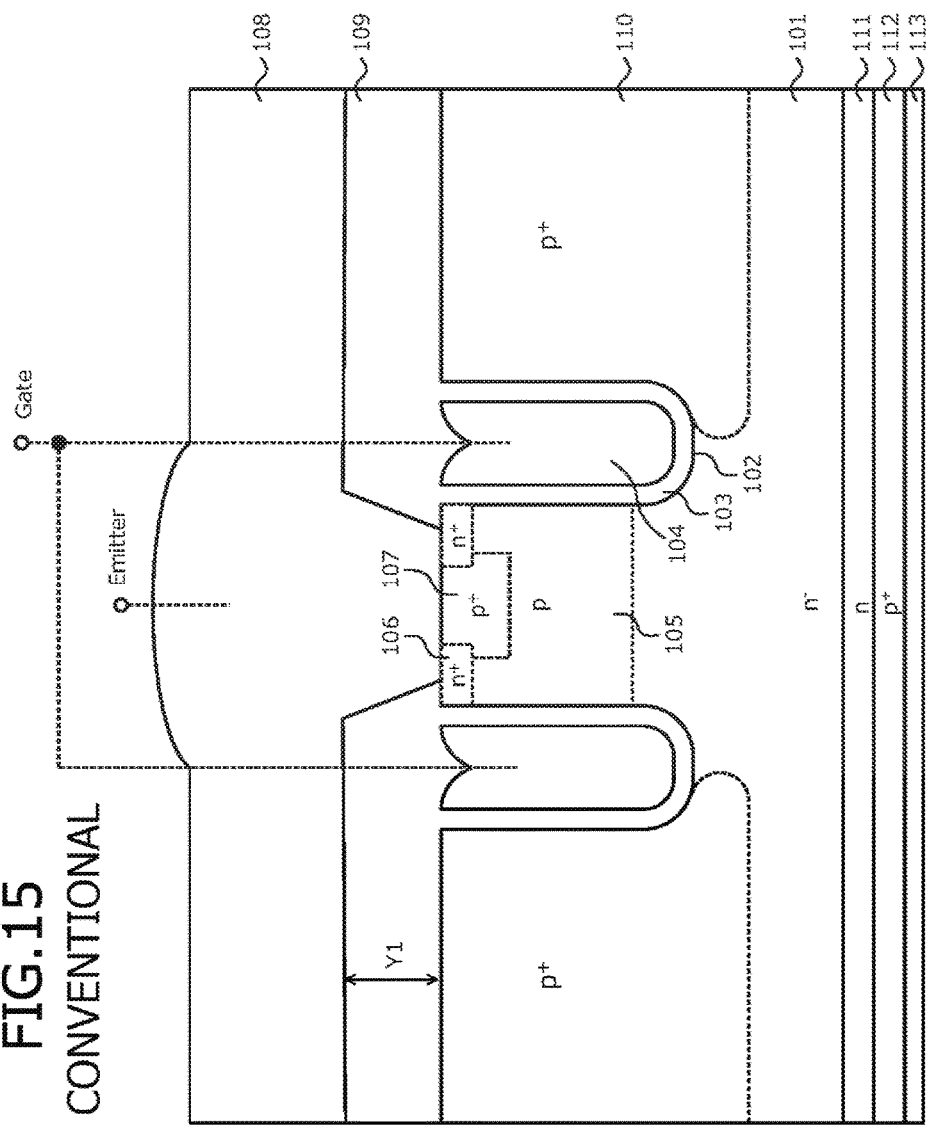
FIG.15
CONVENTIONAL

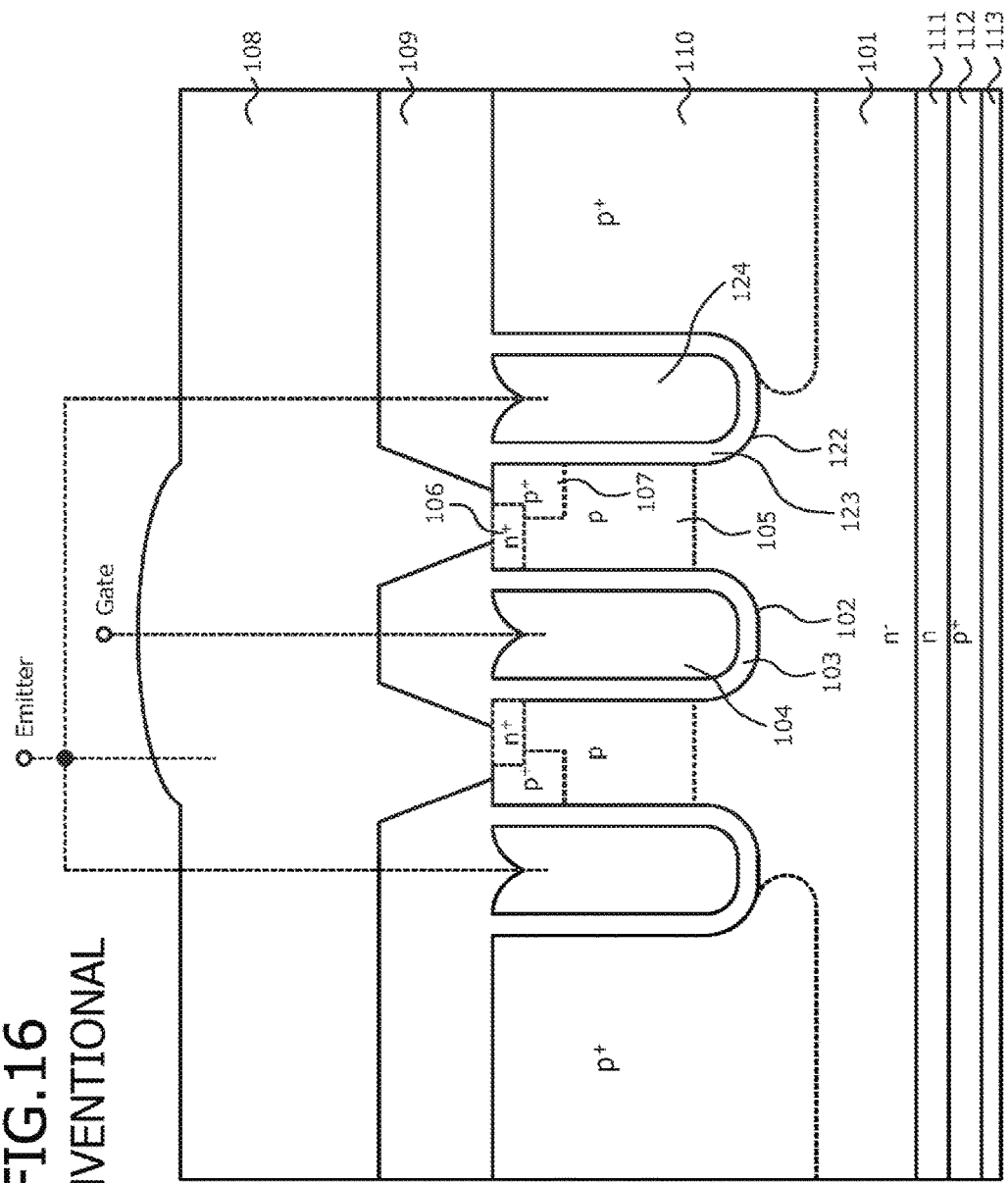
FIG.16
CONVENTIONAL

SEMICONDUCTOR DEVICE HAVING FIRST AND SECOND GATE ELECTRODES

CROSS REFERENCE TO RELATED APPLICATIONS

This is a continuation application of International Application PCT/JP2015/072651 filed on Aug. 10, 2015, which claims priority from Japanese Patent Application No. 2014-167427 filed on Aug. 20, 2014, the contents of which are incorporated herein by reference.

BACKGROUND OF THE INVENTION

1. Field of the Invention

The embodiments discussed herein are related to a semiconductor device and a method of manufacturing a semiconductor device.

2. Description of the Related Art

Insulated gate bipolar transistors (IGBTs) having breakdown voltage ratings of 400V, 600V, 1200V, 1700V, 3300V, or higher and used for semiconductor devices in power semiconductor devices are commonly known. IGBTs are used in power converting equipment such as converters and inverters. Low loss, high efficiency, high breakdown voltage, and low noise are demanded of such power semiconductor devices. Measures for electro-magnetic compatibility (EMC) are particularly important.

EMC is dependent on the rate of voltage change over time (dV/dt) and during inverter operation, the dV/dt of a freewheeling diode ((FWD) (opposing arm)) in a low current region at turn-on of an IGBT (reverse recovery of the FWD (the opposing arm)) is most likely to increase. Therefore, dV/dt has to be reduced to a reasonable value by increasing the gate resistance Rg of the IGBT and reducing the turn-on speed. Thus, improvement of dV/dt controllability at IGBT turn-on (hereinafter, turn-on dV/dt controllability) by gate resistance Rg is important.

A structure of an active region for IGBT current driving will be described taking a typical trench gate-type IGBT as an example. The active region is a region in which current flows during an ON state. FIG. 15 is a cross-sectional view of a structure of a conventional trench gate-type IGBT. As depicted in FIG. 15, in the active region, a trench gate-type metal oxide semiconductor (MOS) insulated gate is disposed on a front surface side of an n$^-$-type semiconductor substrate becoming an n$^-$-type drift layer 101. In particular, on the front surface side of the n$^-$-type semiconductor substrate, a trench (hereinafter, gate trench) 102 is disposed so as to divide a surface layer of the n$^-$-type drift layer 101. A gate electrode 104 is disposed inside the gate trench 102, via a gate insulating film 103.

At a mesa region of n$^-$-type drift layer 101, separated by adjacent gate trenches 102, a p-type base region 105 is disposed. An n$^+$-type emitter region 106 and a p$^+$-type contact region 107 are selectively disposed in the p-type base region 105, in a surface layer of a substrate front surface side of the p-type base region 105. An emitter electrode 108 contacts the n$^+$-type emitter region 106 and the p$^+$-type contact region 107 through a contact hole penetrating, in a depth direction, an interlayer insulating film 109 disposed on a substrate front surface, and is electrically isolated from the gate electrode 104 by the interlayer insulating film 109. In a mesa region where the n$^+$-type emitter region 106 is not disposed, a p$^+$-type region (hereinafter, floating p$^+$-type region) 110 electrically isolated from the emitter electrode 108 by the interlayer insulating film 109 is disposed to secure breakdown voltage.

An n-type field stop (FS) layer 111 and a p$^+$-type collector layer 112 are disposed in a back side of the n$^-$-type semiconductor substrate. A collector electrode 113 contacts a p$^+$-type collector layer 112. In a trench gate-type IGBT of such a conventional structure, hole current flows in the floating p$^+$-type region 110 at turn-on, whereby the electric potential of the floating p$^+$-type region 110 increases and displacement current arising from this electric potential increase flows to the gate electrode 104. As a result, the turn-on speed for the interval related to dV/dt is determined and therefore, turn-on dV/dt controllability degrades (for example, refer to Tokura, N., "Influence of Floating P-Base on Turn-On Characteristics of Trench-Gate FS-IGBT", The Institute of Electrical Engineers Journal D, The Institute of Electrical Engineers of Japan (IEEJ), 2010, Vol. 130, NO. 6, pp. 728-733; and Onozawa, Y., et al, "Development of the next generation 1200V trench-gate FS-IGBT featuring lower EMI noise and lower switching loss", Proceedings of the 19th International Symposium on Power Semiconductor Devices & ICs, (Jejudo), May 27 to 30, 2007, pp. 13-16).

The following device has been proposed as a device that improves turn-on dV/dt controllability by the gate resistance Rg. A first groove and a second groove are formed so as to penetrate a p base layer and n layer, and reach an upper layer portion of an n$^-$ layer. The first groove is adjacent to an n$^+$ emitter region and inside the first groove, a gate electrode is formed. A polysilicon region is formed inside the second groove. The second groove differs from the first groove in that the n$^+$ emitter region is not formed in a neighboring region, and a gate electrode is not formed inside the second groove (for example, refer to Japanese Patent Application Laid-Open Publication No. 2002-353456). Japanese Patent Application Laid-Open Publication No. 2002-353456 adopts a dummy gate structure where a polysilicon region of an emitter electric potential is disposed inside the second groove via an insulating film, whereby holes accumulated in the p base layer pass to the emitter electrode during OFF operation, improving OFF operation characteristics.

A structure of the active region of a trench gate-type IGBT that includes a dummy gate structure will be described. FIG. 16 is a cross-sectional view of another example of a structure of a conventional trench gate-type IGBT. A trench gate-type IGBT having a dummy gate structure depicted in FIG. 16, similar to the typical trench gate-type IGBT depicted in FIG. 15, has a trench gate-type MOS gate structure. Further, a trench (hereinafter, emitter trench) 122 is disposed so as to be adjacent to a trench (gate trench) 102 configuring the MOS gate structure, sandwiching the p-type base region 105 in between. An electrode (dummy gate electrode) 124 of the emitter electric potential is disposed inside the emitter trench 122 via an insulating film (dummy gate insulating film) 123.

Configuration of the trench gate-type IGBT having the dummy gate structure is similar to that of the typical trench gate-type IGBT depicted in FIG. 15 with the exception of the emitter trench 122, the dummy gate insulating film 123, and the dummy gate electrode 124. In the trench gate-type IGBT having the dummy gate structure, in particular, during high voltage such as at turn-on initially, holes accumulate along the emitter trench 122, forming a current path of low resistance through which hole current flows from the floating p$^+$-type region 110 to the emitter electrode 108. Therefore, increased electric potential in the floating p$^+$-type region 110 may be suppressed, improving turn-on dV/dt controllability by the gate resistance Rg to a greater extent than with a typical trench gate-type IGBT.

Further, as another trench gate-type IGBT, a device has been proposed in which a gate electrode inside a trench extends onto a substrate front surface, providing a gate electrode of a floating $p^+$-type region on an entire surface of a substrate front surface side, via an insulating film (for example, refer to U.S. Pat. No. 6,815,769 (FIGS. 11 and 12), Japanese Patent Application Laid-Open Publication No. 2005-191221 (FIG. 9), and Japanese Patent Application Laid-Open Publication No. H5-243561 (paragraph 0099, FIGS. 85, 87, 91, 93)).

SUMMARY OF THE INVENTION

According to one aspect of the present invention, a semiconductor device includes a first semiconductor layer of a first conductivity type; a trench disposed at a predetermined depth from a first principal surface of the first semiconductor layer in a depth direction; a first insulating film disposed inside the trench, along an inner wall of the trench; a first gate electrode inside the trench, disposed on an inner side of the first insulating film; a first semiconductor region of a second conductivity type, disposed in a surface layer of the first principal surface of the first semiconductor layer, at a depth shallower than the trench and contacting the first insulating film of a side wall of the trench; a second semiconductor region of the first conductivity type, disposed selectively in the first semiconductor region; a third semiconductor region of the second conductivity type, disposed in the surface layer of the first principal surface of the first semiconductor layer, contacting the first insulating film of the side wall of the trench, and separated from the first semiconductor region by the trench; a second gate electrode partially covering the third semiconductor region, via the second insulating film; an interlayer insulating film covering the third semiconductor region, the first gate electrode, and the second gate electrode; a first electrode disposed on the interlayer insulating film and contacting first semiconductor region and the second semiconductor region; a second semiconductor layer of the second conductivity type, disposed in a second principal surface of the first semiconductor layer; and a second electrode contacting the second semiconductor layer. Further, Cgp/Csp>2.0 is satisfied, where Cgp is electrostatic capacitance between the third semiconductor region and the first and second gate electrodes and Csp is electrostatic capacitance between the third semiconductor region and the first electrode.

In the semiconductor device, (T4/W3+W2/T1)×(T3/W4) >2.0 is satisfied, where, T1 is a thickness of the second insulating film; T3 is a thickness of a portion of the interlayer insulating film, covering the third semiconductor region; T4 is a thickness of the first gate electrode; W2 is a width of the second gate electrode; W3 is a thickness of the first insulating film; and W4 is a distance from a center line of the third semiconductor region to the second gate electrode.

In the semiconductor device, T3>T1+T2 is satisfied, where, T1 is a thickness of the second insulating film; T2 is a thickness of a portion of the interlayer insulating film covering the second gate electrode; and T3 is a thickness of a portion of the interlayer insulating film covering the third semiconductor region.

In the semiconductor device, a depth of the third semiconductor region is deeper than the trench.

According to another aspect of the invention a method of manufacturing a semiconductor device including a trench disposed at a predetermined depth from a first principal surface of a first semiconductor layer of a first conductivity type; a first semiconductor region of a second conductivity type disposed in a surface layer of the first principal surface of the first semiconductor layer, at a depth shallower than the trench and contacting the trench; a second semiconductor region of the second conductivity type, disposed in the surface layer of the first principal surface of the first semiconductor layer, contacting the trench, and separated from the first semiconductor region by the trench, includes forming a semiconductor layer of the second conductivity type in the surface layer of the first principal surface of the first semiconductor layer; forming the trench at a depth penetrating the semiconductor layer from the first principal surface of the first semiconductor layer so as to divide the semiconductor layer by the trench into regions forming the first semiconductor region and the second semiconductor region; forming a gate insulating film on the first principal surface of the first semiconductor layer and along an inner wall of the trench; forming an electrode layer on the gate insulating film, so as to be embedded inside the trench; selectively removing the electrode layer to leave a first portion embedded inside the trench as a first gate electrode and a second portion covering a portion of the second semiconductor region as a second gate electrode; forming a third semiconductor region selectively in the first semiconductor region after selectively removing the electrode layer; forming an interlayer insulating film on the first principal surface of the first semiconductor layer, covering the second semiconductor region, the first gate electrode, and the second gate electrode; selectively removing the interlayer insulating film and the gate insulating film so as to expose the first semiconductor region and the third semiconductor region; and forming a first electrode contacting the first semiconductor region and the third semiconductor region, after selectively removing the interlayer insulating film and the gate insulating film.

The method further includes depositing an insulating layer on the interlayer insulating film so as to increase a thickness of the interlayer insulating film, after selectively removing the interlayer insulating film and the gate insulating film; and reducing the thickness of the interlayer insulating film at a first portion excluding a second portion covering the second semiconductor region, leaving the thickness of the interlayer insulating film at the second portion, and again exposing the first semiconductor region and the third semiconductor region, after depositing the insulating layer and before forming the first electrode.

The method further includes forming the second semiconductor region inside the semiconductor layer to be deeper than the semiconductor layer and to have a higher impurity concentration than the semiconductor layer, a portion of the semiconductor layer excluding the second semiconductor region being the first semiconductor region, and the second semiconductor region being formed after forming the semiconductor layer and before forming the trench. The trench is formed at an interface of the first semiconductor region and the second semiconductor region.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 15 is a cross-sectional view of a structure of a conventional trench gate-type IGBT; and FIG. 16 is a cross-sectional view of another example of a structure of a conventional trench gate-type IGBT.

DETAILED DESCRIPTION OF THE INVENTION

Figure 1:
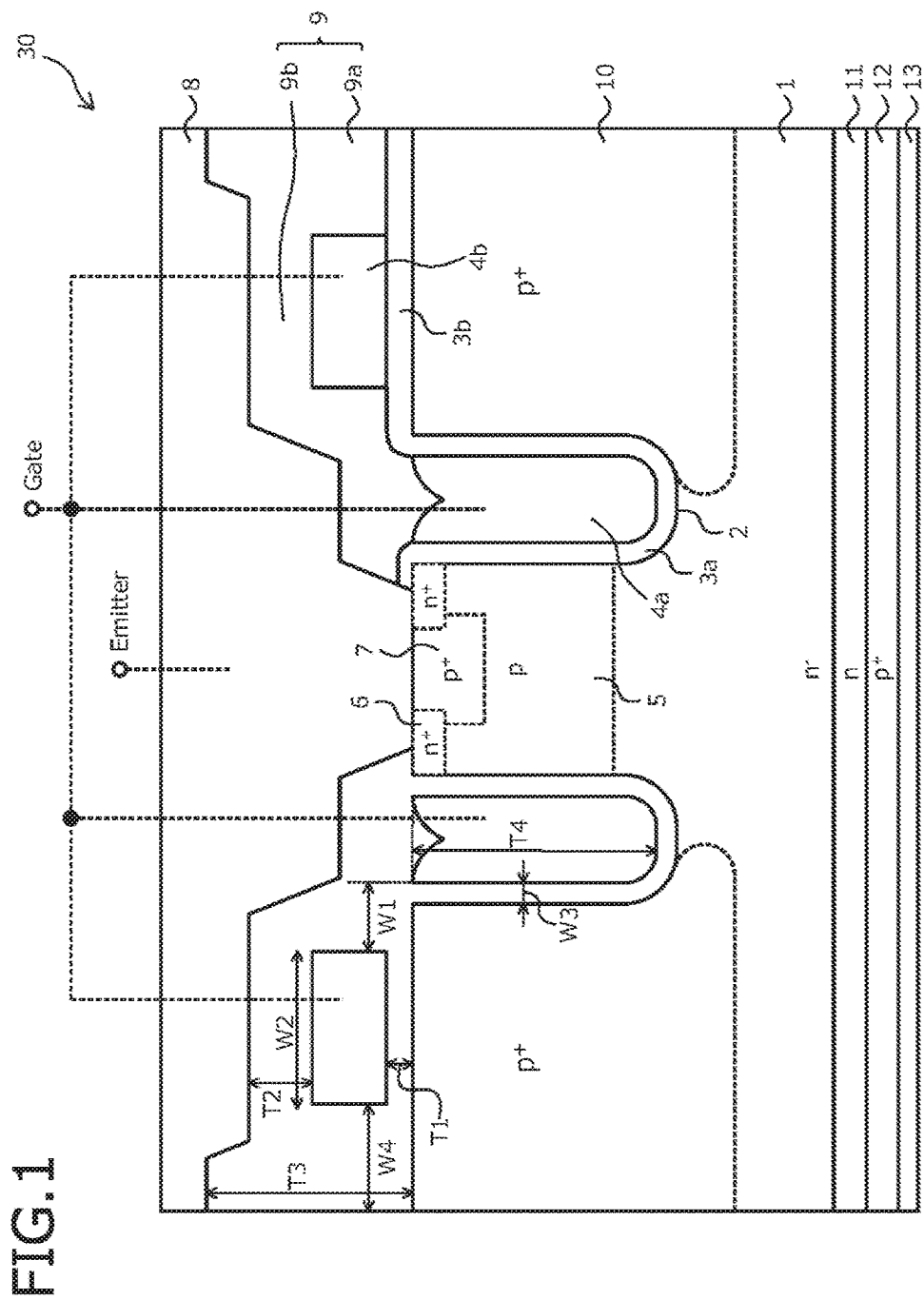
FIG. 1 is a cross-sectional view of a structure of a semiconductor device according to a first embodiment.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described.

A structure of a semiconductor device according to a first embodiment will be described. FIG. 1 is a cross-sectional view of a unit cell structure 30 of the semiconductor device according to the first embodiment. In FIG. 1, an active region (region in which current flows during the ON state) responsible for current driving is depicted and an edge termination structure surrounding a periphery of the active region is not depicted. The edge termination structure is a region that mitigates the electric field of a substrate front surface side of an n$^-$-type drift layer 1, maintains the breakdown voltage, and has, for example, a termination structure combining guard rings, field plates, and reduced surface field (RESURF). Further, in FIG. 1, although a unit cell structure 30 of a MOS gate structure to a center line of a floating p$^+$-type region 10 (described hereinafter) from the MOS gate structure is depicted, embodiments encompass devices and structures in which the unit cell structure 30 is repeated or duplicated within the structure or device.

As depicted in FIG. 1, in the active region, a trench gate-type MOS gate structure is disposed on a front surface of an n$^-$-type semiconductor substrate (semiconductor chip) forming the n$^-$-type drift layer (first semiconductor layer) 1. In particular, in the n$^-$-type drift layer 1, a trench 2 is disposed at a depth that from a substrate front surface, does not reach an n-type field stop layer 11 described hereinafter. The trench 2 is disposed, for example, in a striped planar layout so as to divide a surface layer of the n$^-$-type drift layer 1 into plural elevated regions (mesa regions) relative to the trench 2. Inside the trench 2, a first gate insulating film 3a is disposed along an inner wall of the trench 2, and inside the trench 2, a first gate electrode 4a is disposed on the first gate insulating film 3a.

In a mesa region of the n$^-$-type drift layer 1, separated by adjacent trenches 2, for example, a p-type base region (first semiconductor region) 5 is disposed at a depth shallower than the trenches. The p-type base region 5 contacts the first gate insulating film 3a disposed on the side walls of the trenches and faces the first gate electrode 4a, across the first gate insulating film 3a. In the p-type base region 5, n$^+$-type emitter regions (second semiconductor region) 6 are selectively disposed in the surface layer of the substrate front surface side of the p-type base region 5. The n$^+$-type emitter regions 6 contact the first gate insulating film 3a disposed on the side wall of the trench 2 and face the first gate electrode 4a, across the first gate insulating film 3a. Further, in the p-type base region 5, a p$^+$-type contact region 7 may be selectively formed so as to contact the n$^+$-type emitter regions 6. Hereinafter, description will be given taking, as an example, a case where the p$^+$-type contact region 7 is disposed.

Further, a p$^+$-type region (floating p$^+$-type region (third semiconductor region)) 10 of a floating electric potential is located in a mesa region of the n$^-$-type drift layer 1, separated by the adjacent trenches 2, and electrically insulated from an emitter electrode 8 by an interlayer insulating film 9. The floating p$^+$-type region 10 is disposed so as to face the p-type base region 5, across the trench 2. Further, the floating p$^+$-type region 10 is separated from the p-type base region 5 by a pn junction between the floating p$^+$-type region 10 and the n$^-$-type drift layer 1. The floating p$^+$-type region 10 and the p-type base region 5, for example, are repeatedly, alternately disposed sandwiching the trench 2 therebetween. The floating p$^+$-type region 10 has a function of maintaining breakdown voltage.

A depth of the floating p$^+$-type region 10 is, for example, deeper than a depth of the trench 2. A corner portion of an underside (substrate back surface side) of the floating p$^+$-type region 10, for example, extends to a position directly below a bottom surface of the trench 2. A second gate electrode 4b is selectively disposed on a surface of the substrate front surface side of the floating p$^+$-type region 10, via a second gate insulating film 3b of, for example, an oxide film (SiO$_2$ film). In other words, the second gate electrode 4b partially covers a surface of the floating p$^+$-type region 10, via the second gate insulating film 3b. Thus, selective disposal of the second gate electrode 4b enables increases of Miller capacitance (capacitance between the gate and collector functioning as input capacitance related to multiplied gain by the Miller effect) to be suppressed to a greater extent that in a case where the entire surface of the floating p$^+$-type region is covered by a gate electrode as with conventional techniques.

Further, selective disposal of the second gate electrode 4b in this manner enables the ratio (hereinafter, Cgp/Csp ratio) of electrostatic capacitance (hereinafter, floating-gate capacitance) Cgp between the floating p$^+$-type region 10 and the first and second gate electrodes 4a, 4b to electrostatic capacitance (hereinafter, floating-emitter capacitance) Csp between the floating p$^+$-type region 10 and the emitter electrode 8 to be increased. As a result, turn-on dV/dt controllability by the gate resistance Rg may be improved. The second gate electrode 4b, for example, is electrically connected by wiring to the first gate electrode 4a.

Further, the second gate electrode 4b is disposed closer to the trench 2 than to a center (i.e., a center between the adjacent trenches 2) of the floating p$^+$-type region 10. In particular, the first and second gate electrodes 4a, 4b and the interlayer insulating film 9 described hereinafter, for example, may be disposed so as to satisfy inequality (1). The reason for this is that by setting the Cgp/Csp ratio (Cgp=T4/W3+W2/T1, Csp=W4/T3) to be greater than 2.0, the maximum value of dV/dt (hereinafter, maximum dV/dt) may be decreased irrespective of the value of the gate resistance Rg. As a result, turn-on dV/dt controllability by the gate resistance Rg may be further improved.

$$(T4/W3+W2/T1) \times (T3/W4) > 2.0 \quad (1)$$

T1 is a thickness of the second gate insulating film 3b (i.e., a thickness of a portion of the insulating film between the second gate electrode 4b and the floating p$^+$-type region 10). T3 is a thickness of a portion 9a of the interlayer insulating film 9, covering the floating p$^+$-type region 10 (i.e., a thickness of the interlayer insulating film 9, at a portion of the interlayer insulating film 9 between the emitter electrode 8 and floating p$^+$-type region 10). T4 is a thickness of the first gate electrode 4a (maximal thickness). W1 is a distance between the first gate electrode 4a and the second gate electrode 4b. W2 is a width of the second gate electrode 4b (a width along a direction along which the trenches 2 are arranged, hereinafter, simply "width"). W3 is a thickness of the first gate insulating film 3a. W4 is a distance from the center line of the floating p$^+$-type region 10 to the second gate electrode 4b (i.e., a length that is ½ the width of the interlayer insulating film 9, at the portion 9a covering the floating p$^+$-type region 10).

In one embodiment, the second gate insulating film 3b is formed of a same material as the first gate insulating film 3a. As will be described below, in one embodiment the first and second gate insulating films 3a and 3b are formed in the same deposition step. In one embodiment, the second gate insulating film 3b is formed of a same material as the interlayer insulating film 9. While junctions of the first and second gate insulating films 3a and 3b and the interlayer insulating film 9 are not depicted, according to one embodiment, the first gate insulating film 3a is located in the trench 2, the second gate insulating film 3b is located between the second gate electrode 4b and the floating p+-type region 10, and the interlayer insulating film covers the second gate electrode 4b and portions of the p+-type region 10 not covered by the second gate electrode 4b.

The interlayer insulating film 9 is disposed on the substrate front surface, covering the floating p$^+$-type region 10 and the first and second gate electrodes 4a, 4b. T3 (the thickness of the portion 9a of the interlayer insulating film 9 covering the floating p$^+$-type region 10) and T2 (a thickness of a portion of the interlayer insulating film 9 covering the second gate electrode 4b, i.e., a thickness of the interlayer insulating film 9, at a portion of the interlayer insulating film 9 between the emitter electrode 8 and the second gate electrode 4b) may satisfy inequality (2), below, with respect to T3 (the thickness of the portion 9a of the interlayer insulating film 9 covering the floating p$^+$-type region 10). The reason for this is that by increasing T3 (the thickness of the portion 9a of the interlayer insulating film 9 covering the floating p$^+$-type region 10), the floating-emitter capacitance Csp may be reduced and the Cgp/Csp ratio may be increased. When T3 (the thickness of the portion 9a of the interlayer insulating film 9 covering the floating p$^+$-type region 10) is formed by a conventional process flow, the sum of T1 (the thickness of the second gate insulating film 3b) and T2 (the thickness of the portion of the interlayer insulating film 9 covering the second gate electrode 4b) becomes (T3=T1+T2) and therefore, the thickness T3 may be made greater than the sum of T1 and T2.

$$T3 > T1 + T2 \quad (2)$$

The emitter electrode (first electrode) 8 contacts the n$^+$-type emitter regions 6 and the p$^+$-type contact region 7 via a contact hole that penetrates the interlayer insulating film 9 in the depth direction. The emitter electrode 8 is electrically isolated from the first and second gate electrodes 4a, 4b by the interlayer insulating film 9. In a surface layer of a back surface of the n$^-$-type semiconductor substrate forming the n$^-$-type drift layer 1, the n-type field stop layer 11 is disposed from the active region, over the edge termination structure. Further, a p$^+$-type collector layer (second semiconductor layer) 12 is disposed in the surface layer of the back surface of the n$^-$-type semiconductor substrate, from the active region, over the edge termination structure, at a depth that is shallower than the n-type field stop layer 11 from the substrate back surface. A collector electrode (second electrode) 13 contacts the p$^+$-type collector layer 12.

Figure 2:
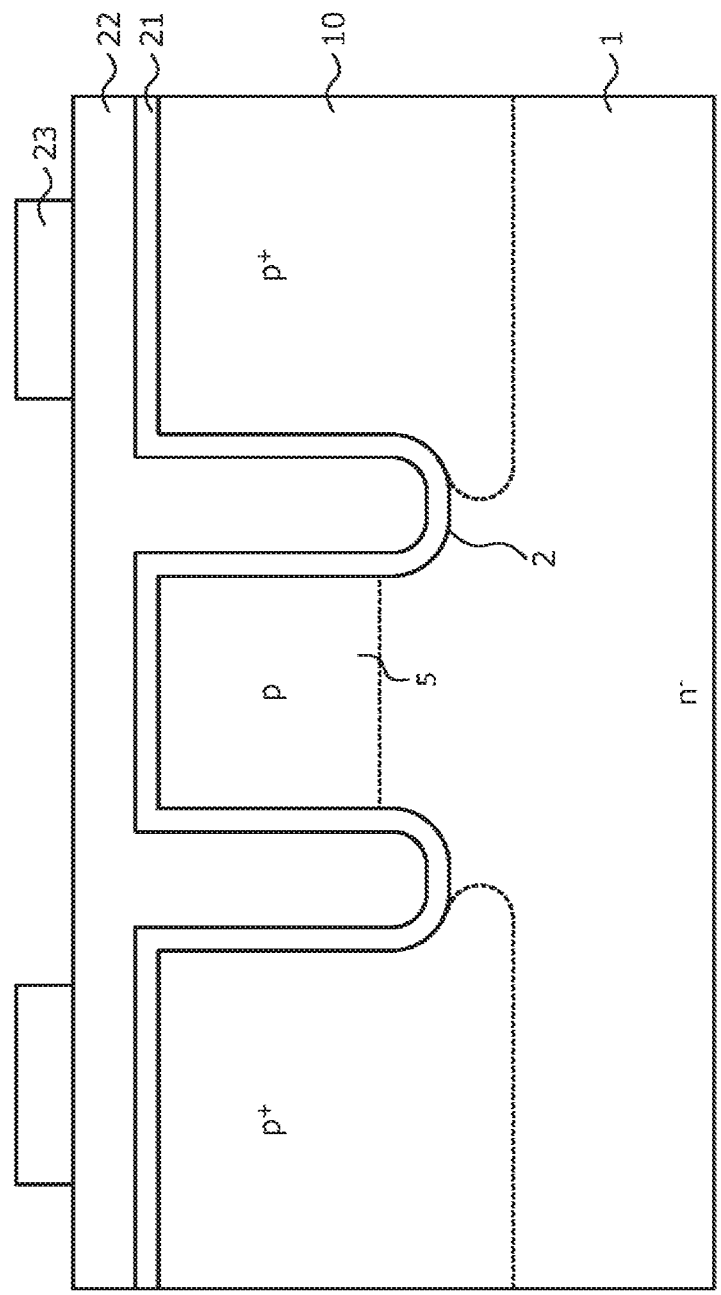
FIGS. 2, 3, 4, 5, 6, 7, and 8 are cross-sectional views of the semiconductor device according to the first embodiment during manufacture.

A method of manufacturing a semiconductor device according to the first embodiment will be described taking as an example, a case where a 1200V IGBT is produced (manufactured). FIGS. 2, 3, 4, 5, 6, 7, and 8 are cross-sectional views of the semiconductor device according to the first embodiment during manufacture. FIGS. 2 to 8 depict only the active region. As depicted in FIG. 2, an n$^-$ type semiconductor wafer (semiconductor substrate) to become the n$^-$-type drift layer (first semiconductor layer) 1 is prepared. In a front surface of the semiconductor wafer, for example, a p-type impurity such as boron (B) is ion implanted and activation annealing (heat treatment) is performed, whereby the p-type base region (first semiconductor region (semiconductor layer)) 5 is formed in in active region, in a surface layer of the front surface of the semiconductor wafer. Next, for example, the front surface of the wafer is thermally oxidized by heat treatment in a water-vapor atmosphere to thereby form an oxide film (SiO$_2$ film) not depicted) on the front surface of the wafer. A portion of the oxide film corresponding to a formation region of the floating p$^+$-type region 10 is removed by photolithography and etching.

The remaining portion of the oxide film is used as mask to ion implant a p-type impurity such as boron in the p-type base region 5 and selectively increase the impurity concentration of the p-type base region 5, whereby the floating p$^+$-type region (second semiconductor region (semiconductor layer)) 10 is selectively formed in the surface layer of the front surface of the semiconductor wafer. The oxide mask used for the ion implantation is completely removed and thereafter, on the front surface of the wafer, again, an oxide film (not depicted) is formed. A portion of the oxide film corresponding to a formation region of the trench 2 is removed by photolithography and etching. The remaining portion of the oxide film is used as a mask to perform anisotropic dry etching of a silicon portion and form at a border of the p-type base region 5 and the floating p$^+$-type region 10, the trench 2 penetrating the p-type base region 5 in the depth direction, reaching the n$^-$-type drift layer 1. A width of the trench 2, for example, may be about 0.5 µm to 1.5 µm. A depth of the trench 2, for example, may be about 1.0 µm to 6.0 µm.

Next, for example, the front surface of the wafer and the inner wall of the trench 2 are thermally oxidized by heat treatment in a water-vapor atmosphere to form along the front surface of the wafer and the inner wall of the trench 2, an oxide film (SiO$_2$ film) 21 to become the first and second gate insulating films 3a, 3b. A thickness of the oxide film 21, for example, may be about 50 nm to 200 nm. On the front surface of the wafer, a polysilicon (Poly-Si) layer 22 to become the first and second gate electrodes 4a, 4b is deposited so as to be embedded inside the trench 2. A thickness of the polysilicon layer 22, at a portion of the polysilicon layer 22 on the front surface of the wafer is, for example, about 0.3 µm to 1.0 µm. Next, for example, the p-type base region 5 and the floating $p^+$-type region 10 are activated by heat treatment at 1100 degrees C. A resist mask 23 covering a portion corresponding to a formation region of the second gate electrode 4b is formed on the polysilicon layer 22 by photolithography and etching.

Figure 3:
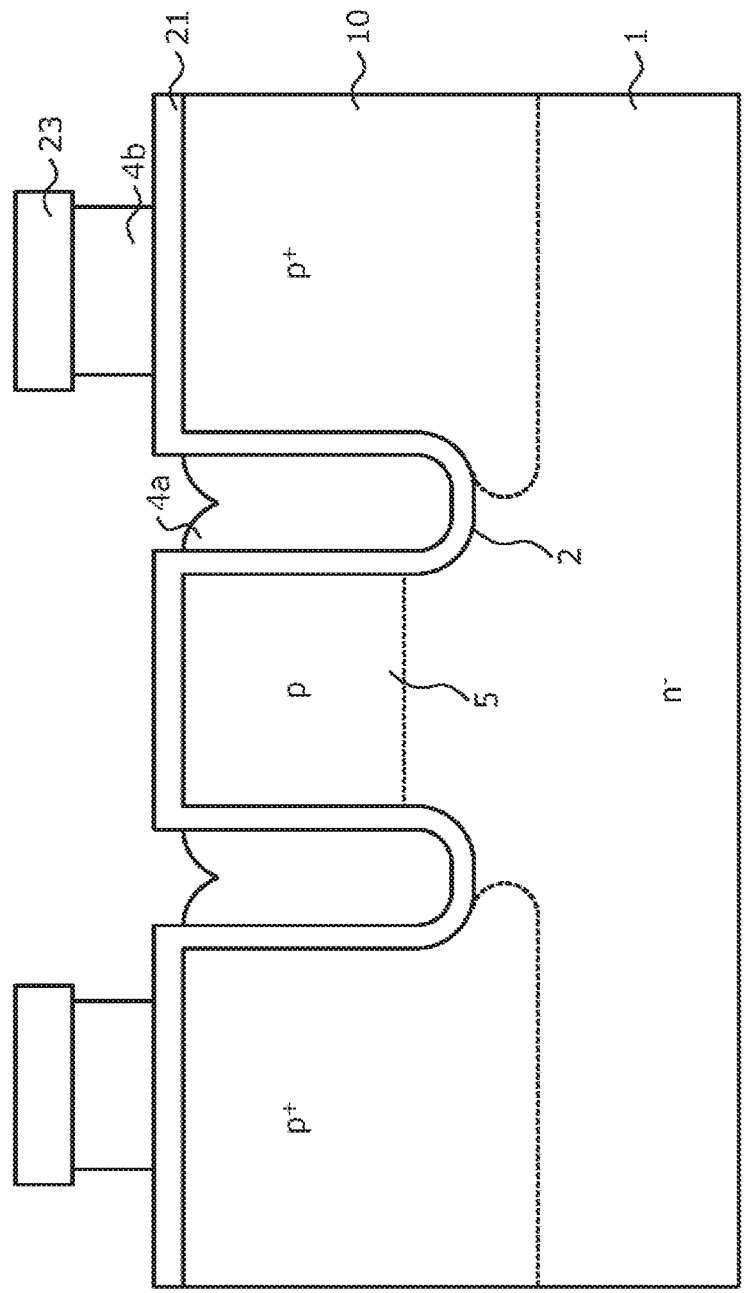
Figure 4:
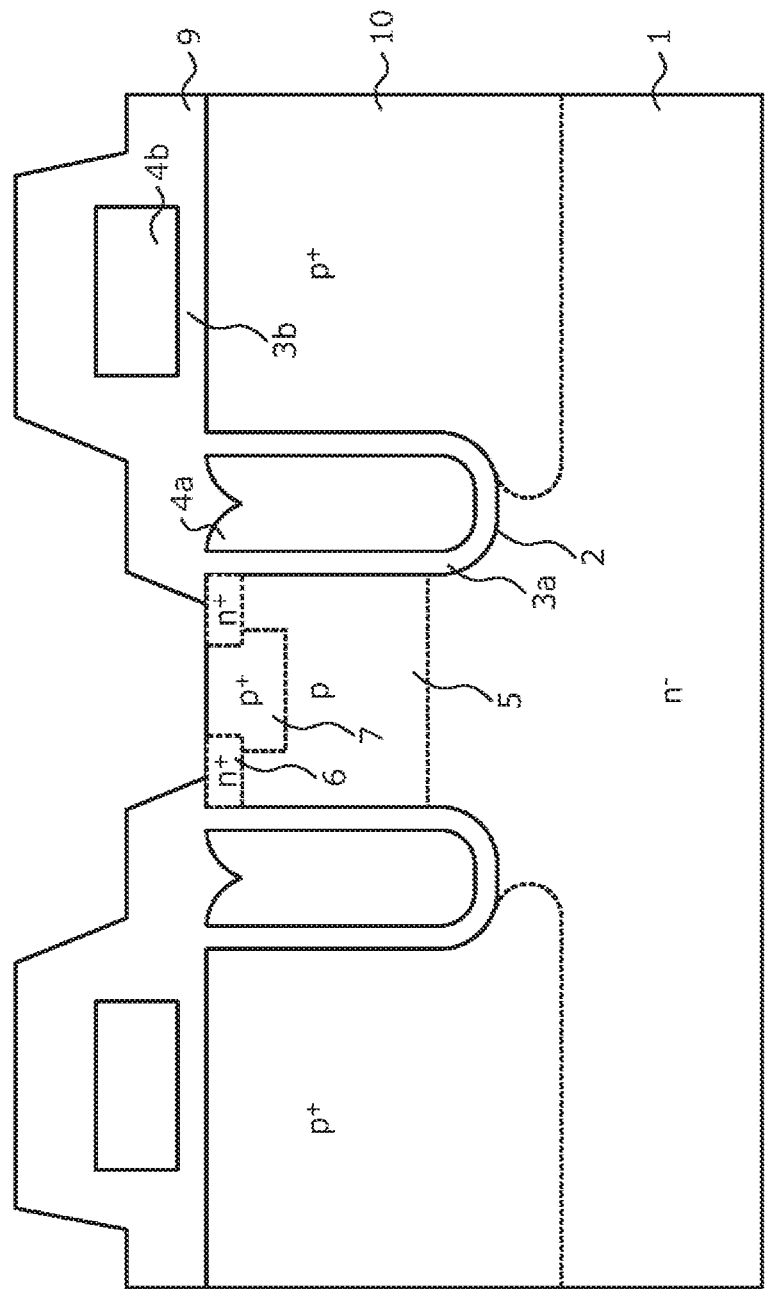

As depicted in FIG. 3, the resist mask 23 is used as a mask and, for example, by isotropic dry etching, the polysilicon layer 22 is removed, leaving portions of the polysilicon layer 22 corresponding to the first gate electrodes 4a inside the trench 2 and corresponding to the second gate electrodes 4b on the front surface of the wafer. Thus, the remaining portion of the polysilicon layer 22 in the trench 2 becomes the first gate electrodes 4a and the portion selectively remaining on the front surface of the wafer becomes the second gate electrodes 4b. As depicted in FIG. 4, after the resist mask 23 is removed, a resist mask (not depicted) opened at a portion corresponding to a formation region of the $p^+$-type contact region 7 is formed on the front surface of the wafer by photolithography and etching. The resist mask is used as a mask and, for example, a p-type impurity such as boron is ion implanted, whereby the $p^+$-type contact region 7 is selectively formed in a surface layer of the p-type base region 5. The resist mask used to form the $p^+$-type contact region 7 is removed.

A resist mask (not depicted) opened at portions corresponding to formation regions of the $n^+$-type emitter regions 6 is formed on the front surface of the wafer by photolithography and etching. The resist mask is used as a mask and, for example, an n-type impurity such as arsenic (As) is ion implanted, whereby the $n^+$-type emitter regions (third semiconductor region) 6 are selectively formed in the surface layer of the p-type base region 5. The resist mask used for forming the $n^+$-type emitter regions 6 is removed. Next, for example, the $n^+$-type emitter regions 6 and the $p^+$-type contact region 7 are activated by heat treatment at 1000 degrees C. Next, for example, a high temperature oxide (HTO) film about 0.2 µms thick and a Boro Phospho Silicate Glass (BPSG) film about 0.8 µms thick are sequentially deposited (first deposition of the interlayer insulating film 9) on the front surface of the wafer as the interlayer insulating film 9. Thus, the first and second gate electrodes 4a, 4b, the p-type base region 5, and the floating $p^+$-type region 10 are covered by the interlayer insulating film 9.

Figure 5:
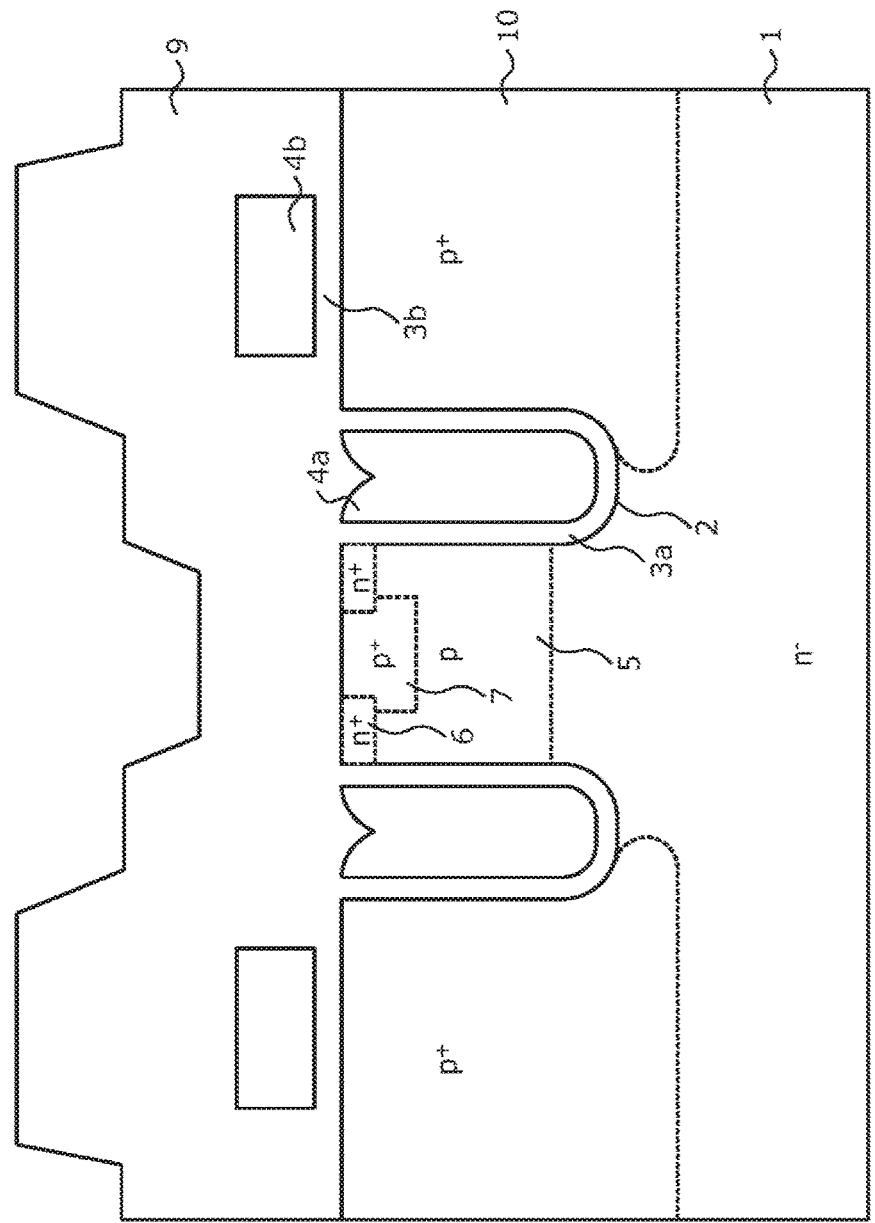
Figure 6:
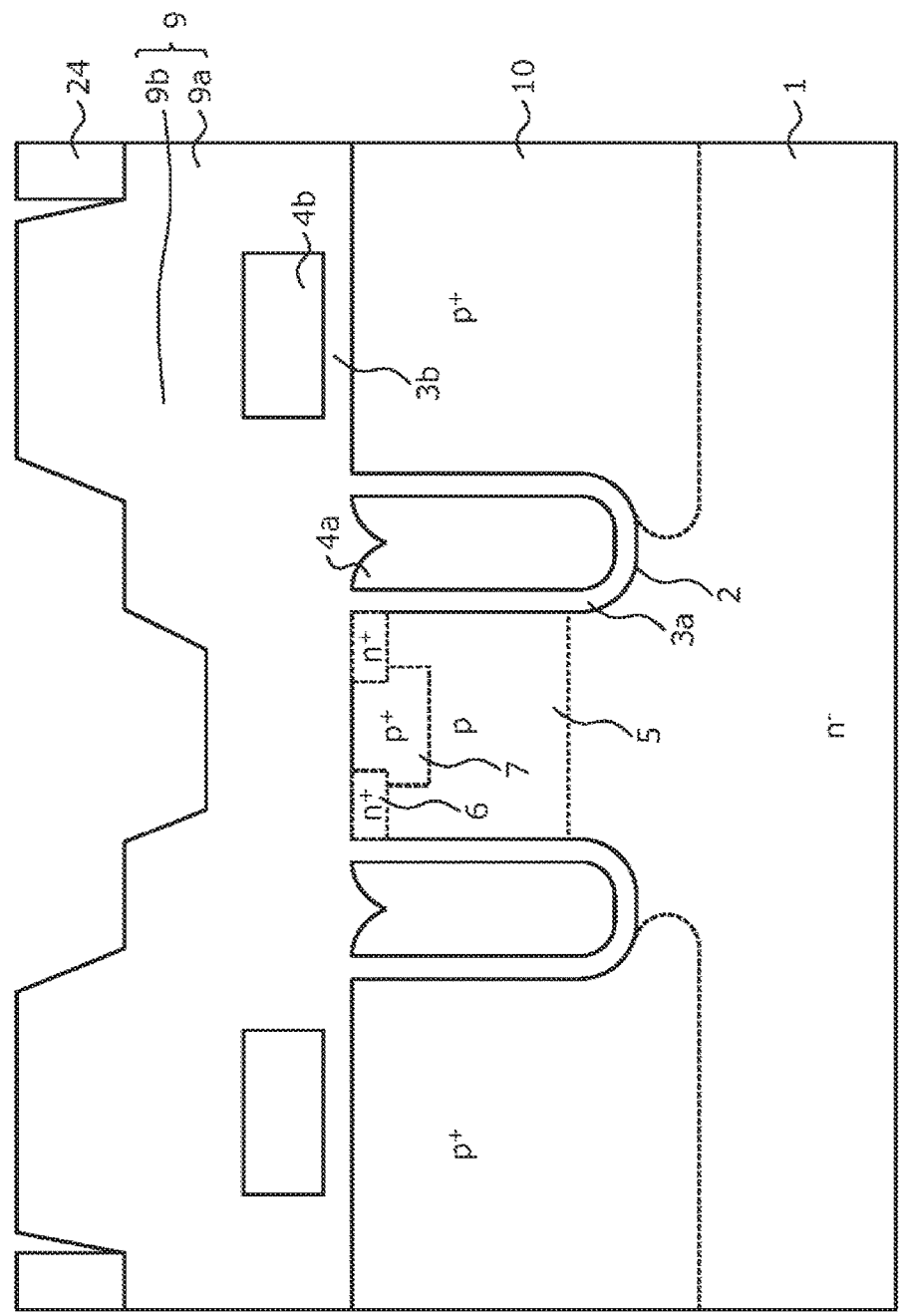

A resist mask (not depicted) opened at a portion corresponding to a formation region of a contact hole is formed by photolithography and etching. The resist mask is used as a mask to etch the interlayer insulating film 9 and the oxide film 21 to form a contact hole, exposing the $n^+$-type emitter regions 6 and $p^+$-type contact region 7. Here, a portion of the oxide film 21 remaining inside the trench 2 becomes the first gate insulating film 3a and a portion remaining on the front surface of the wafer becomes the second gate insulating film 3b. As depicted in FIG. 5, an HTO film (insulating layer) about 0.1 µms to 1.0 µms thick is deposited on the front surface of the wafer as the interlayer insulating film 9 to increase the thickness of the interlayer insulating film 9 (second deposition of the interlayer insulating film 9). As depicted in FIG. 6, a resist mask 24 covering the portion 9a (i.e., a portion of the interlayer insulating film 9, covering the floating $p^+$-type region 10) where the floating-emitter capacitance Csp occurs is formed by photolithography and etching.

Figure 7:
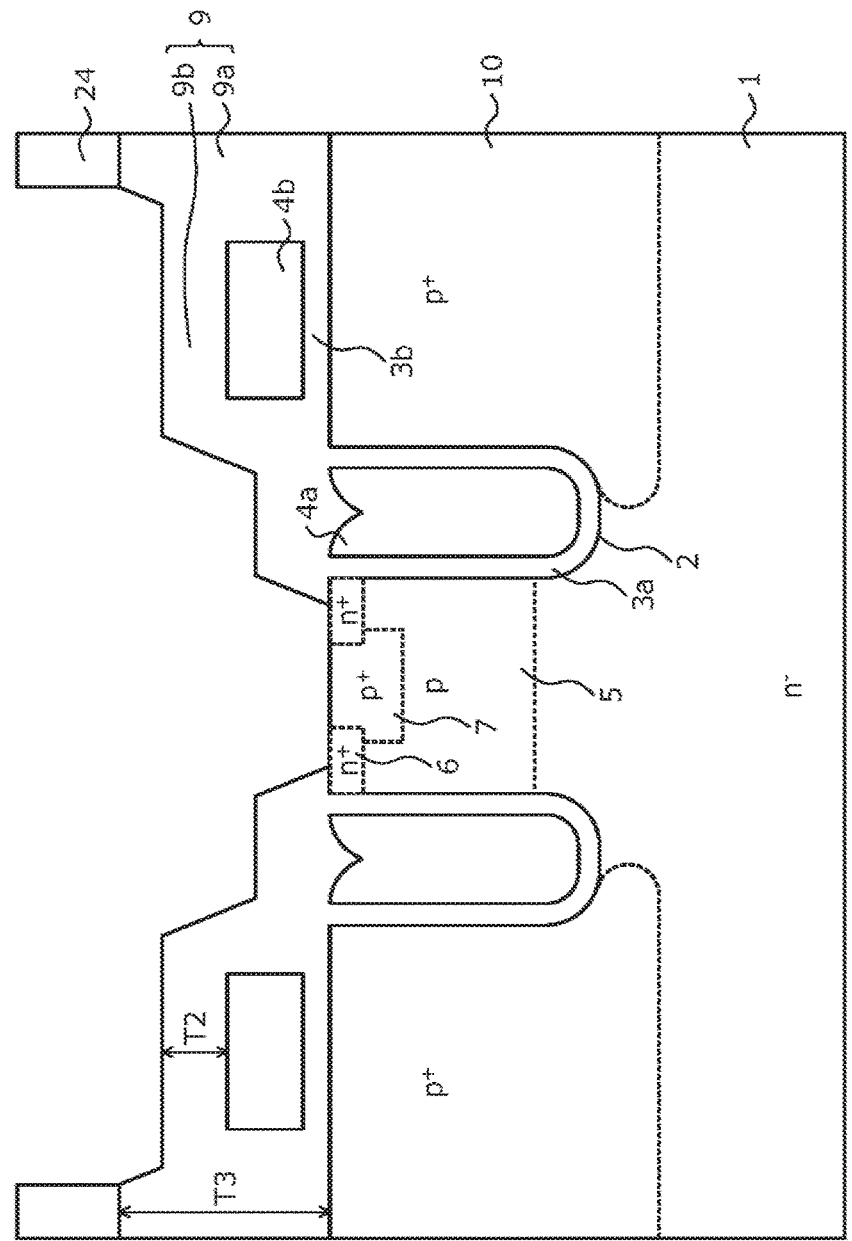
Figure 8:
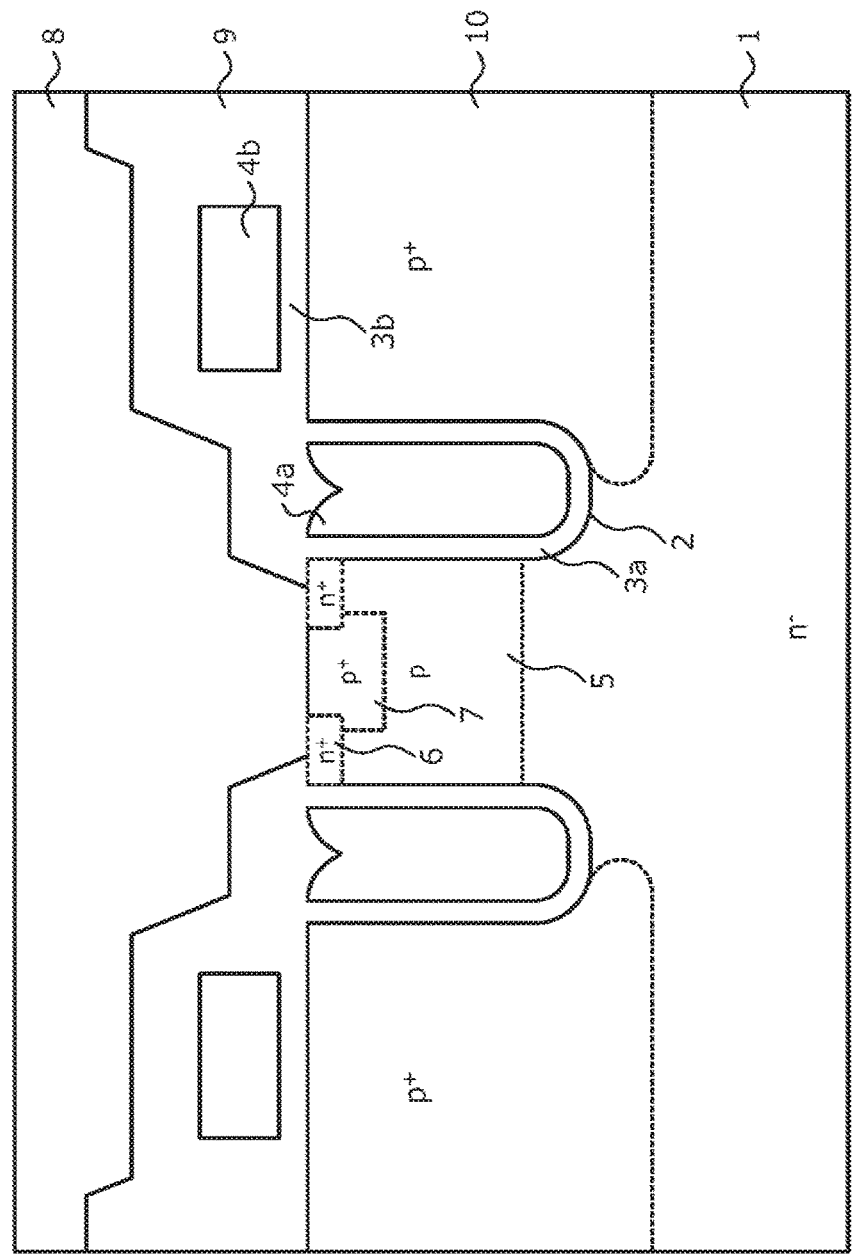

As depicted in FIG. 7, the resist mask 24 is used as a mask to etch the interlayer insulating film 9 until the $n^+$-type emitter regions 6 and the $p^+$-type contact region 7 are exposed. In other words, a contact hole exposing the $n^+$-type emitter regions 6 and the $p^+$-type contact region 7 is again formed at the same position. Here, a portion 9b of the interlayer insulating film 9 covering the first and second gate electrodes 4a, 4b is not covered by the resist mask 24. Therefore, the thickness T2 of the portion of the interlayer insulating film 9 covering the second gate electrode 4b becomes thinner than the thickness T3 of the portion 9a of the interlayer insulating film 9 covering the floating $p^+$-type region 10. As depicted in FIG. 8, after the resist mask 24 is removed, for example, an aluminum-silicon (Al—Si) layer forming the emitter electrode (first electrode) 8 is deposited (formed) on the front surface of the wafer by a sputtering method so as to be embedded in the contact hole. Next, the front surface of the wafer, for example, is protected by a resist film (not depicted).

The semiconductor wafer is polished and etched from a back surface side to make a thickness of the semiconductor wafer, for example, 120 µm, which is a product thickness. The thickness of the semiconductor wafer is a silicon thickness from an interface of the collector electrode 13 and the $p^+$-type collector layer 12 to an interface of the floating $p^+$-type region 10 and the interlayer insulating film 9. From the back surface of the semiconductor wafer after grinding, for example, phosphorus (P), selenium (Se), or protons ($H^+$) are ion implanted in the $n^-$-type drift layer 1, whereby the n-type field stop layer 11 is formed in the surface layer of the ground back surface of the semiconductor wafer. Next, for example, boron is ion implanted in the n-type field stop layer 11 from the ground back surface of the semiconductor wafer, whereby the $p^+$-type collector layer (second semiconductor layer) 12 is formed at a position shallower than the n-type field stop layer 11 from the back surface of the wafer. The collector electrode (second electrode) 13 is formed on the $p^+$-type collector layer 12. Thereafter, the semiconductor wafer is diced (cut) into chips, whereby the IGBT chip depicted in FIG. 1 is completed.

As described, according to the first embodiment, by partially covering the surface of the floating $p^+$-type region by the second gate electrode, increases of the Miller capacitance are suppressed, the ratio of the floating-gate capacitance to the floating-emitter capacitance (Cgp/Csp ratio) may be increased, and dV/dt at turn-on may be reduced. Therefore, turn-on dV/dt controllability by the gate resistance Rg may be improved. Further, with the conventional structure, dV/dt has to be decreased by increasing the gate resistance Rg and slowing the turn-on speed. However, according to the first embodiment, by increasing the Cgp/Csp ratio, the dV/dt may be reduced and therefore, turn-on loss may be prevented from increasing without having to increase the gate resistance Rg. Further, when the emitter trench is disposed conventionally, screening of the dummy gate insulating film disposed along the inner wall of the emitter trench cannot be performed and a problem arises in that defective dummy gate insulating films are difficult to detect by a test for detecting devices having an initial defect. However, according to the first embodiment, since the emitter trench is not disposed, this problem does not arise. In other words, turn-on dV/dt controllability by the gate resistance Rg may be improved without providing the emitter trench, which is conventionally disposed.

Further, according to the first embodiment, the floating p+-type region is partially covered by the second gate electrode, whereby the floating-gate capacitance may be adjusted irrespective of the thickness of the second gate insulating film between the floating p+-type region and the second gate electrode. Therefore, the second gate insulating film, for example, may be formed concurrently with the first gate insulating film disposed along the side wall of the trench, enabling the manufacturing process to be simplified. Further, although the thicker the interlayer insulating film is, the more difficult the formation of the contact hole is, according to the first embodiment, a contact hole is formed each time an insulating film becoming the interlayer insulating film is deposited and therefore, even when the thickness of the portion of the interlayer insulating film covering the floating p+-type region is made thicker than the thickness of the interlayer insulating film, at the portion covering the first and second gate electrodes, the contact hole may be formed easily.

Figure 9:
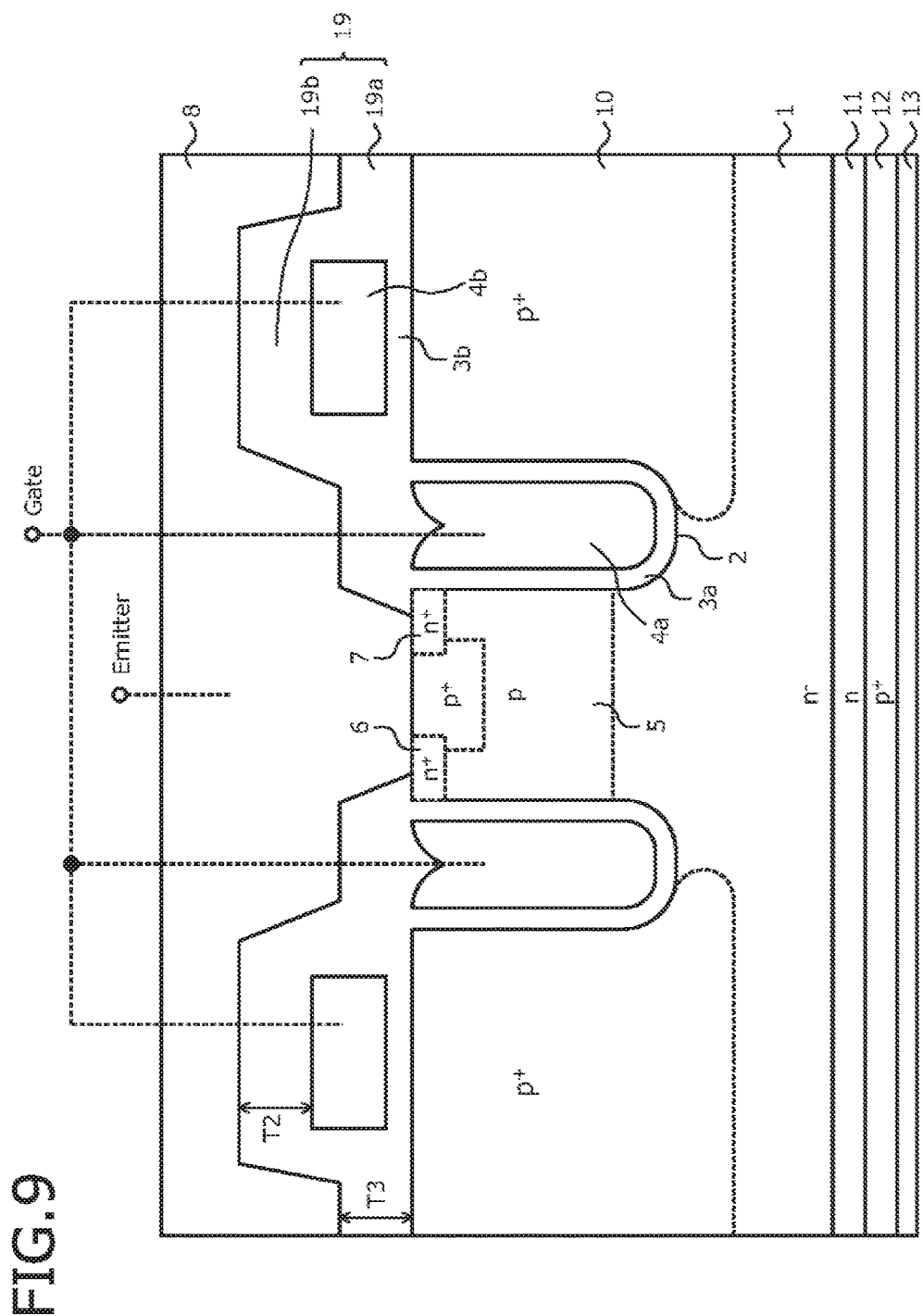
FIG. 9 is a cross-sectional view of a structure of a semiconductor device according to a second embodiment.

A structure of the semiconductor device according to a second embodiment will be described. FIG. 9 is a cross-sectional view of a structure of the semiconductor device according to the second embodiment. The semiconductor device according to the second embodiment differs from the semiconductor device according to the first embodiment in that a thickness T3 of a portion 19a of an interlayer insulating film 19 covering in the floating p+-type region 10 and a thickness T2 of a portion of the interlayer insulating film 19 covering the second gate electrode 4b are equivalent. When the thickness T3 of the portion 19a of the interlayer insulating film 19 covering in the floating p+-type region 10 at least satisfies inequality (1), obtaining a predetermined Cgp/Csp ratio, the thickness T3 of the portion 19a of the interlayer insulating film 19 covering in the floating p+-type region 10 (i.e., the thickness of the interlayer insulating film 9, at a portion of the interlayer insulating film 9 where the floating-emitter capacitance Csp occurs) may be changed.

The method of manufacturing a semiconductor device according to the second embodiment, for example, forms the emitter electrode 8 after forming the contact hole after the first deposition of the interlayer insulating film 19 (refer to FIGS. 2 to 4), omitting the second deposition of the interlayer insulating film 9 in the method of manufacturing a semiconductor device according to the first embodiment. In other words, the thicknesses of the portion 19a of the interlayer insulating film 19 covering the floating p+-type region 10 and a portion 19b covering the first and second gate electrodes 4b are maintained by the thickness at the first deposition of the interlayer insulating film 19. In particular, similar to the first embodiment, processes from the formation of the p-type base region 5 to the formation of the contact hole after the first deposition of the interlayer insulating film 19 are sequentially performed. Thereafter, similar to the first embodiment, processes from the formation of the emitter electrode 8 and thereafter are sequentially performed, whereby the IGBT chip depicted in FIG. 9 is completed.

As described, according to the second embodiment, effects identical to those of the first embodiment may be achieved. Further, according to the second embodiment, a process for increasing the thickness of the portion of the interlayer insulating film covering the floating p+-type region may be omitted and therefore, manufacturing processes may be reduced, enabling reduced costs.

Figure 10:
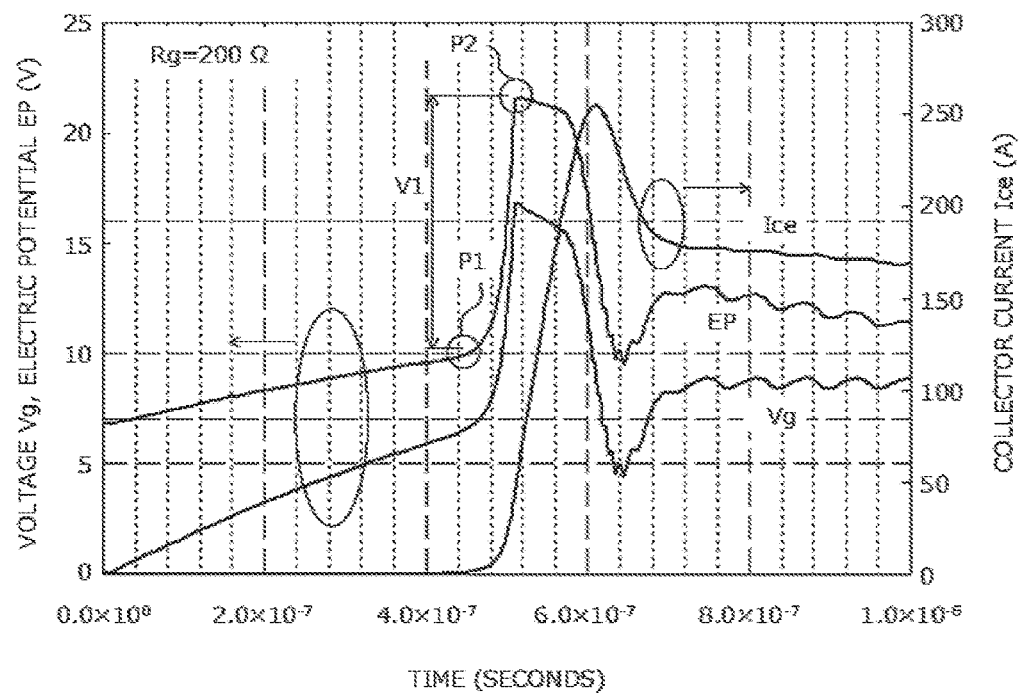
FIG. 10 is a characteristic diagram of electrical characteristics during turn-on of a trench gate-type IGBT of a first conventional example.

An example will be described. Verification of an optimal range of the Cgp/Csp ratio was performed. Collector current Ice, gate voltage (gate electric potential) Vg, and electric potential EP of the floating p+-type region 110 during turn-on were measured for a conventional trench gate-type IGBT (hereinafter, first conventional example) depicted in FIG. 15. The gate resistance Rg was 200Ω. Temporal variation of the collector current Ice, the gate voltage (gate electric potential) Vg, and the electric potential EP of the floating p+-type region 110 during turn-on for first conventional example is depicted in FIG. 10. FIG. 10 is a characteristic diagram of electrical characteristics during turn-on of the trench gate-type IGBT of the first conventional example. As depicted in FIG. 10, in the first conventional example, when the collector current Ice begins to flow, during an interval (time elapse) from observation point P1 to observation point P2, the electric potential EP of the floating p+-type region 110 sharply increases and a peak is observed. Further, accompanying the sharp increase of the electric potential EP of the floating p+-type region 110, the gate voltage Vg sharply increases and a peak is observed.

Such sharp increase of the electric potential of the floating p+-type region 110 during the interval from observation point P1 to observation point P2 is a factor related to generation of gate displacement current (displacement current flowing into the gate electrode 104), which makes turn-on dV/dt controllability by the gate resistance Rg poor. Therefore, the amount of electric potential increase V1 of the floating p+-type region 110 during the interval becomes an index of turn-on dV/dt controllability by the gate resistance Rg and the smaller this value is, the better. The amount of electric potential increase V1 of the floating p+-type region 110 is the difference (electric potential difference) of the electric potential at a peak starting point (observation point P1) of the sharp electric potential increase of the floating p+-type region 110 and the electric potential at a peak end point (observation point P2). Therefore, the greater the electric potential EP of the floating p+-type region 110 is at observation point P1 and the smaller the electric potential EP of the floating p+-type region 110 is at observation point P2, the smaller the amount of electric potential increase V1 of the floating p+-type region 110 becomes and the turn-on dV/dt controllability by the gate resistance Rg improves.

In increasing the electric potential EP of the floating p+-type region 110 at observation point P1, a large the rate of electric potential EP change over time (the slope of the electric potential waveform) of the floating p+-type region 110 during the interval (the time elapsing from 0 seconds until observation point P1) from when the collector current Ice begins to flow until observation point P1 is desirable. The rate of electric potential EP change over time of the floating p+-type region 110 is determined by the electrostatic capacitance (floating-emitter capacitance) Csp between the floating p+-type region 110 and the emitter electrode 108, and the electrostatic capacitance (floating-gate capacitance) Cgp between the floating p+-type region 110 and the gate electrode 104. When the floating-gate capacitance Cgp is greater than the floating-emitter capacitance Csp (Cgp>Csp), the rate of electric potential EP change over time of the floating p+-type region 110 increases and becomes the same rate of change over time as the maximum gate voltage.

Meanwhile, in decreasing the electric potential EP of the floating p+-type region 110 at observation point P2, the following conditions are desirably satisfied. The electric potential EP of the floating p+-type region 110 at observation point P2 is the electric potential required for holes accumulated in the floating p+-type region 110 by the collector current Ice to flow to the emitter electrode 108. In particular, the electric potential EP of the floating p+-type region 110 at observation point P2 is the electric potential for producing in a portion of the n⁻-type drift layer 101 along the trench 102, a p-type inversion layer connected to the floating p⁺-type region 110 and the p-type base region 105 by the electric potential difference between the floating p⁺-type region 110 and the gate electrode 104. Therefore, a large difference of the electric potential EP of the floating p⁺-type region 110 at observation point P1 and the gate voltage Vg is favorable. Accordingly, making the floating-gate capacitance Cgp greater than the floating-emitter capacitance Csp and increasing the electric potential EP of the floating p⁺-type region 110 at observation point P1 is related to decreasing the electric potential EP of the floating p⁺-type region 110 at observation point P2.

Figure 11:
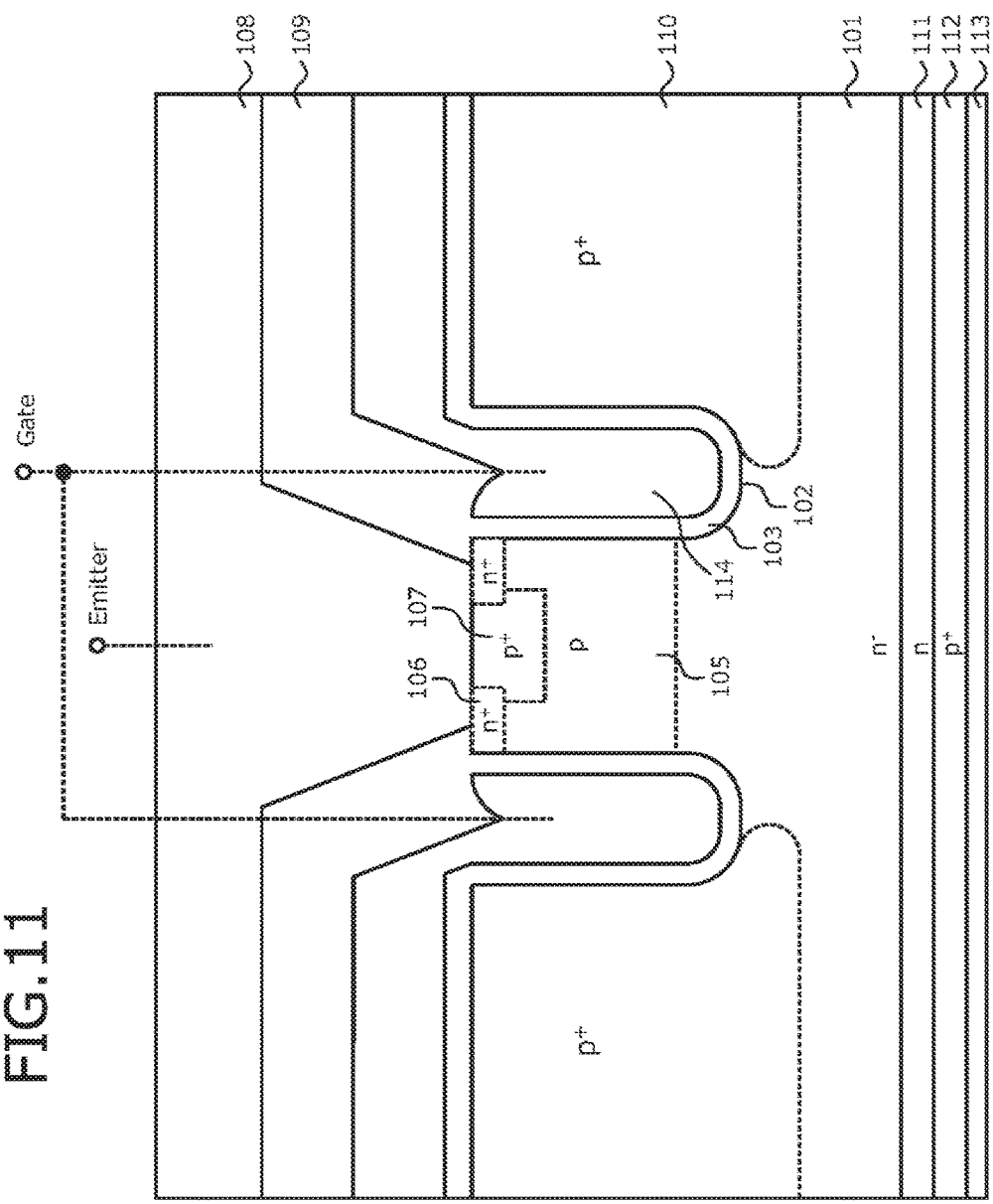
FIG. 11 is a cross-sectional view of a structure of a trench gate-type IGBT of a second conventional example.

In the first conventional example, the rate of electric potential EP change over time of the floating p⁺-type region 110 during the interval from when the collector current Ice begins to flow until observation point P1 is less the rate of gate voltage Vg change over time during the same interval. Therefore, to improve the turn-on dV/dt controllability by the gate resistance Rg, the floating-gate capacitance Cgp has to be made larger than the floating-emitter capacitance Csp. Thus, for a trench gate-type IGBT (hereinafter, second conventional example) where the floating-emitter capacitance Csp=0 is assumed and the entire surface of the substrate front surface side of the floating p⁺-type region 110 is covered by a gate electrode 114 as in U.S. Pat. No. 6,815,769, and Japanese Patent Application Laid-Open Publication Nos. 2005-191221 and H5-243561, measurements identical to those of the first conventional example were performed. FIG. 11 is a cross-sectional view of a structure of the trench gate-type IGBT of the second conventional example. As depicted in FIG. 11, in the second conventional example, the gate insulating film 103 and the gate electrode 114 disposed inside the trench 102 are pulled up onto the substrate front surface and the gate electrode 114 is disposed on the entire surface of the substrate front surface side of floating p⁺-type region 110, via the gate insulating film 103. Configuration excluding the gate electrode 114 of the second conventional example is identical to that of the first conventional example.

Figure 12:
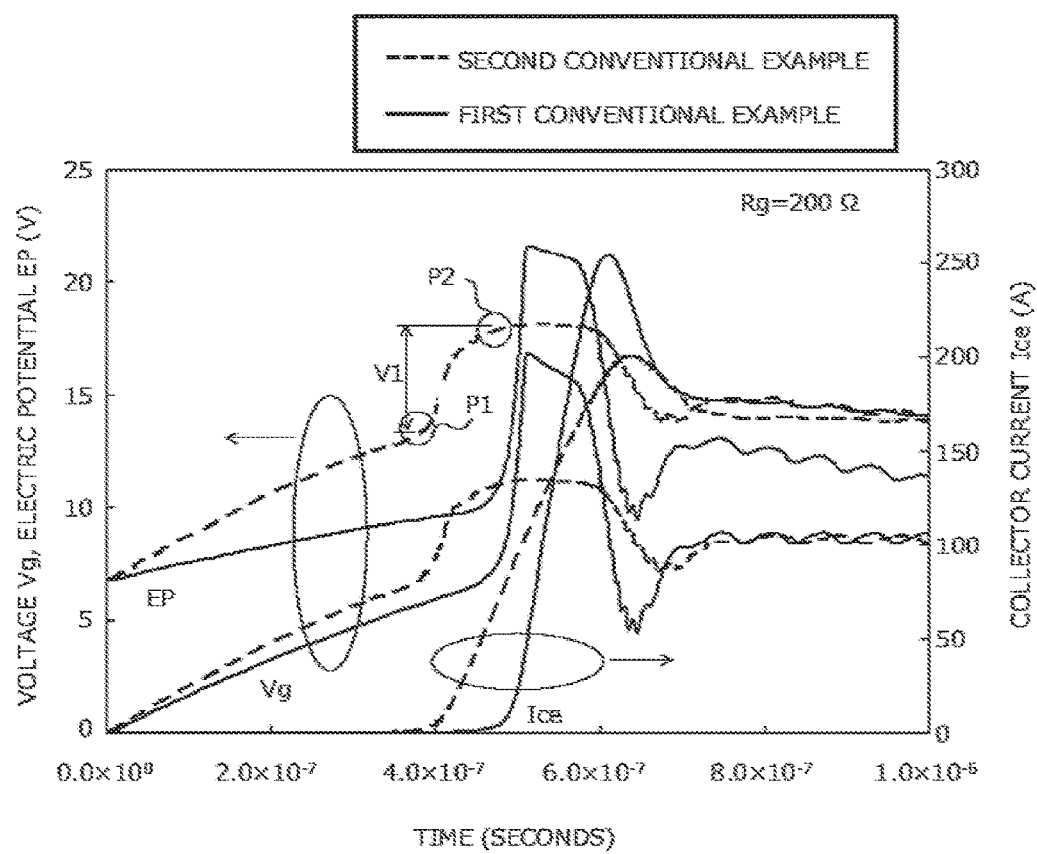
FIG. 12 is a characteristic diagram of electrical characteristics during turn-on of the trench gate-type IGBT of the second conventional example.

Temporal changes of the collector current Ice, the gate voltage Vg, and the electric potential EP of the floating p⁺-type region 110 during turn-on of the second conventional example are depicted in FIG. 12. FIG. 12 is a characteristic diagram of electrical characteristics during turn-on of the trench gate-type IGBT of the second conventional example. In FIG. 12, the collector current Ice, the gate voltage Vg, and the electric potential EP of the floating p⁺-type region 110 during turn-on of the second conventional example are depicted by a broken line and the collector current Ice, the gate voltage Vg, and the electric potential EP of the floating p⁺-type region 110 during turn-on of the first conventional example in FIG. 10 are depicted by a solid line. As depicted in FIG. 12, in the second conventional example, temporal variation of the electric potential EP of the floating p⁺-type region 110 during the interval from when the collector current Ice begins to flow until observation point P1 follows the temporal variation of the gate voltage Vg for the same interval. Therefore, since the difference (electric potential difference) of the electric potential at the peak starting point (observation point P1) of the sharp electric potential increase of the floating p⁺-type region 110 and the electric potential at the peak end point (observation point P2) is small and therefore, the amount of electric potential increase V1 of the floating p⁺-type region 110 becomes small.

Figure 13:
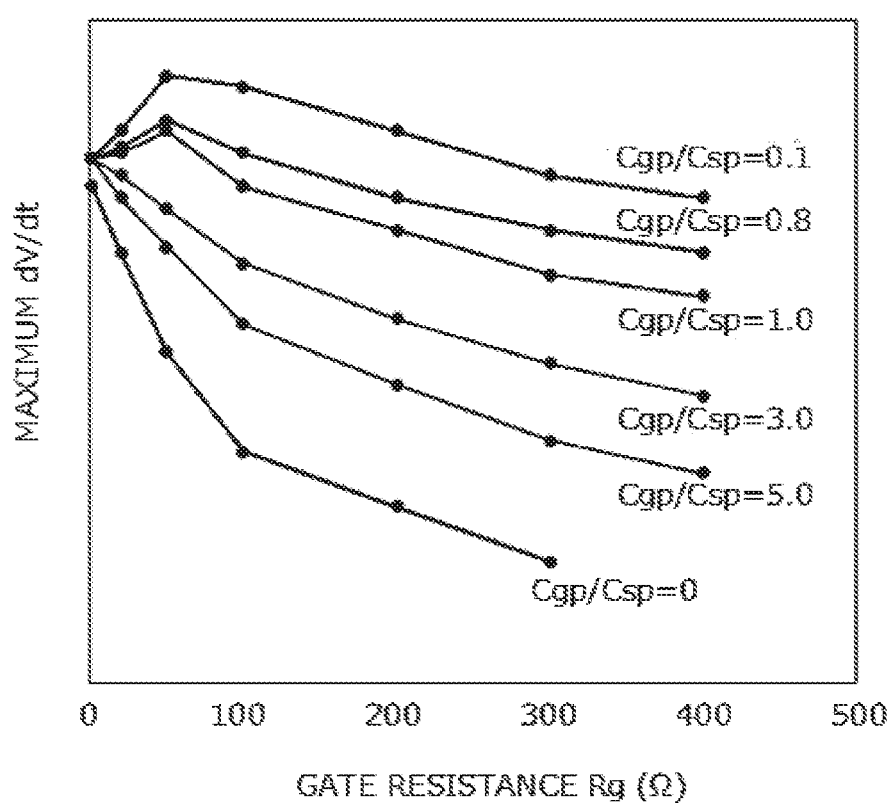
FIG. 13 is a characteristic diagram of turn-on controllability by gate resistance Rg of the trench gate-type IGBTs of the first and second conventional examples.

With respect to the second conventional example (Csp=0) and first conventional examples for which the Cgp/Csp ratio differed (Cgp/Csp=0.1 to 5.0), gate resistance Rg was varied and the maximum value of dV/dt (maximum dV/dt) was measured. FIG. 13 is a characteristic diagram of turn-on controllability by the gate resistance Rg of the trench gate-type IGBTs of the first and second conventional examples. In the first conventional examples, the floating-emitter capacitance Csp was changed by changing the thickness Y1 of the interlayer insulating film 109. As depicted in FIG. 13, among the first conventional examples, even when the Cgp/Csp ratio of those inferior to the second conventional example was about 0.8 to 1.0, the maximum dV/dt was confirmed to be made smaller, the larger the Cgp/Csp ratio was made. In other words, the larger the Cgp/Csp ratio was made, the rate of electric potential EP change over time of the floating p⁺-type region 110 during the interval from when the collector current Ice started to flow until observation point P1 became large, meaning that the turn-on dV/dt controllability by the gate resistance Rg improved.

Figure 14:
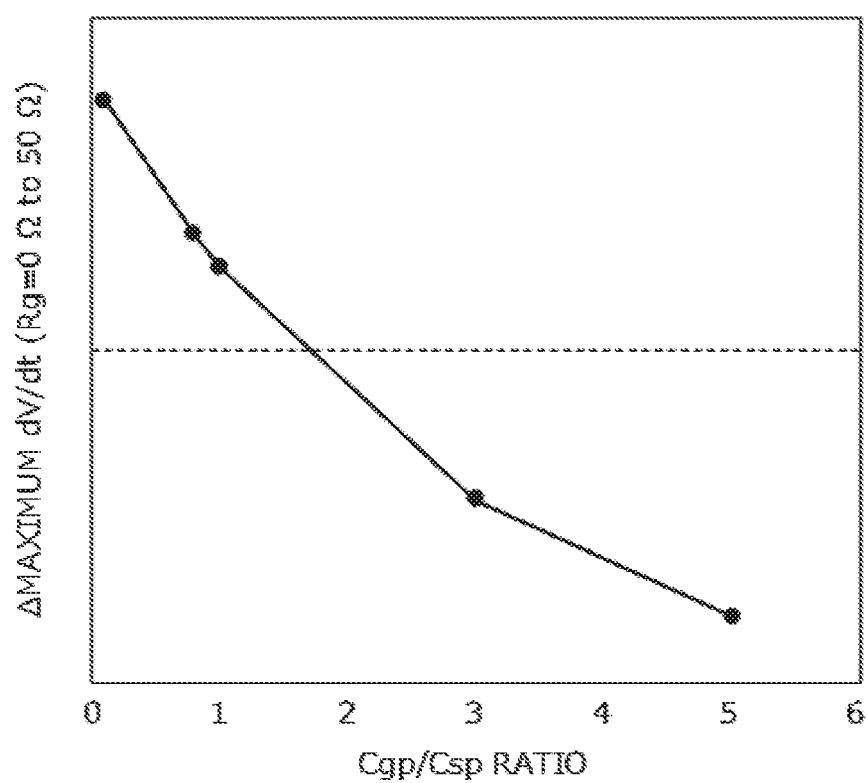
FIG. 14 is a characteristic diagram of the relationship of a Cgp/Csp ratio and a Δ maximum dV/dt of the trench gate-type IGBT of the first conventional examples.

However, in the first conventional examples, when the Cgp/Csp ratio was 0.8 to 1.0, the maximum dV/dt when the gate resistance Rg=1Ω to 50Ω increased more than the maximum dV/dt when the gate resistance Rg=0Ω and the turn-on dV/dt controllability by the gate resistance Rg did not improve at all. Thus, for each of the first conventional examples of differing Cgp/Csp ratios, the difference (the amount of change of the maximum dV/dt (hereinafter, Δ maximum dV/dt)) of the maximum dV/dt when the gate resistance Rg=0Ω subtracted from the maximum dV/dt when the gate resistance Rg=50Ω was calculated, and an approximated curve indicating the relationship of the Cgp/Csp ratio and the Δ maximum dV/dt was created. The results are depicted in FIG. 14. FIG. 14 is a characteristic diagram of the relationship of the Cgp/Csp ratio and the Δ maximum dV/dt of the trench gate-type IGBT of the first conventional examples. From the results depicted in FIG. 14, it is known that the maximum dV/dt when the gate resistance Rg=50Ω is desirably at least less than the maximum dV/dt when the gate resistance Rg=0Ω. In other words, the Δ maximum dV/dt is desirably at least a negative value (Δ maximum dV/dt<0). Therefore, in the present invention, from the approximated curve depicted in FIG. 14, it is known that the Cgp/Csp ratio is desirably greater than 2.0 (Cgp/Csp>2.0).

Herein, various modifications of the invention are possible and in the embodiments above, for example, dimensions, surface concentrations, etc. of parts may be set according to required specifications. Further, in each embodiment, although the first conductivity is assumed to be an n-type and the second conductivity is assumed to be a p-type, the present invention is applicable when the first conductivity is the p-type and the second conductivity is the n-type.

Nonetheless, in a conventional trench gate-type IGBT having a dummy gate structure like that described in Japanese Patent Application Laid-Open Publication No. 2002-353456 (for example, refer to FIGS. 15, 16), even during low voltage such as the ON state, holes tend to accumulate near the emitter trench 122 more so than near the gate trench 102, whereby the resistance with respect to the hole current passing through the p-type base region 105 is reduced. Therefore, a problem arises in that the injection enhancement (IE) effect diminishes, prompting the ON voltage to increase.

However, according to the semiconductor device and the method of manufacturing a semiconductor device of the present invention, by partially covering the third semiconductor region by the second gate electrode, increase of the Miller capacitance may be suppressed and the ratio of the electrostatic capacitance between the third semiconductor region and the first and second gate electrodes to the electrostatic capacitance between the third semiconductor region and the first electrode may be increased, and the dV/dt at turn-on may be decreased. As a result, an effect is achieved in that turn-on dV/dt controllability by the gate resistance Rg may be improved.

As described, the semiconductor device and the method of manufacturing a semiconductor device according to the present invention is useful for, for example, semiconductor devices used in power converting equipment such as converters and inverters, and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
a first semiconductor layer of a first conductivity type;
a trench disposed to a first depth from a first principal surface of the first semiconductor layer in a depth direction;
a first insulating film disposed inside the trench, along an inner wall of the trench;
a first gate electrode inside the trench, disposed on an inner side of the first insulating film;
a first semiconductor region of a second conductivity type, disposed in a surface layer of the first principal surface of the first semiconductor layer, to a second depth shallower than the first depth and contacting the first insulating film;
a second semiconductor region of the first conductivity type, disposed selectively in the first semiconductor region;
a third semiconductor region of the second conductivity type, disposed in the surface layer of the first principal surface of the first semiconductor layer, contacting the first insulating film, and separated from the first semiconductor region by the trench;
a second gate electrode partially covering the third semiconductor region, and separated from the third semiconductor region by a second insulating film;
an interlayer insulating film covering the third semiconductor region, the first gate electrode, and the second gate electrode;
a first electrode disposed on the interlayer insulating film and contacting first semiconductor region and the second semiconductor region;
a second semiconductor layer of the second conductivity type, disposed in a second principal surface of the first semiconductor layer; and
a second electrode contacting the second semiconductor layer,
wherein Cgp/Csp>2.0 is satisfied, where Cgp is electrostatic capacitance between the third semiconductor region and the first and second gate electrodes and Csp is electrostatic capacitance between the third semiconductor region and the first electrode,
wherein the first gate electrode is separated from the second gate electrode above the third semiconductor region by a distance W1, and
wherein a width of the third semiconductor region is greater than a width of the second gate electrode.

2. The semiconductor device according to claim 1, wherein
(T4/W3+W2/T1)×(T3/W4)>2.0 is satisfied, where, T1 is a thickness of the second insulating film; T3 is a thickness of a portion of the interlayer insulating film, covering the third semiconductor region; T4 is a thickness of the first gate electrode; W2 is a width of the second gate electrode; and W3 is a thickness of the first insulating film; and W4 is a distance from a center line of the third semiconductor region to the second gate electrode.

3. The semiconductor device according to claim 1, wherein
T3>T1+T2 is satisfied, where, T1 is a thickness of the second insulating film; T2 is a thickness of a portion of the interlayer insulating film covering the second gate electrode; and T3 is a thickness of a portion of the interlayer insulating film covering the third semiconductor region.

4. The semiconductor device according to claim 1, wherein
a depth of the third semiconductor region is deeper than the trench.

* * * * *